(12) United States Patent
Bogaerts et al.

(10) Patent No.: US 8,741,684 B2
(45) Date of Patent: Jun. 3, 2014

(54) CO-INTEGRATION OF PHOTONIC DEVICES ON A SILICON PHOTONICS PLATFORM

(75) Inventors: Wim Bogaerts, Melle (BE); Joris Van Campenhout, Grimbergen (BE); Peter Verheyen, Leuven (BE); Philippe Absil, Leuven (BE)

(73) Assignees: IMEC, Leuven (BE); Universiteit Gent, Ghent (BE)

( * ) Notice: Subject to any disclaimer, the term of this patent is extended or adjusted under 35 U.S.C. 154(b) by 0 days.

(21) Appl. No.: 13/466,766

(22) Filed: May 8, 2012

(65) Prior Publication Data
US 2012/0288971 A1 Nov. 15, 2012

Related U.S. Application Data

(60) Provisional application No. 61/484,064, filed on May 9, 2011.

(51) Int. Cl.
*H01L 31/18* (2006.01)
*H01L 31/0352* (2006.01)
*H01L 31/12* (2006.01)

(52) U.S. Cl.
USPC ........ 438/69; 438/59; 438/481; 257/E31.096; 257/E31.032

(58) Field of Classification Search
USPC .......................... 438/24, 73, 57, 69, 59, 481; 257/E31.011, E31.096, E31.032
See application file for complete search history.

(56) References Cited

U.S. PATENT DOCUMENTS

| | | | |
|---|---|---|---|
| 6,075,253 A | 6/2000 | Sugiyama et al. | |
| 6,469,785 B1 * | 10/2002 | Duveneck et al. | 356/244 |
| 7,616,904 B1 | 11/2009 | Gunn, III et al. | |
| 2004/0121507 A1 * | 6/2004 | Bude et al. | 438/93 |
| 2004/0188794 A1 | 9/2004 | Gothoskar et al. | |
| 2006/0251375 A1 | 11/2006 | Morse | |
| 2007/0010066 A1 * | 1/2007 | Takaya | 438/396 |
| 2007/0228384 A1 * | 10/2007 | Kermarec et al. | 257/75 |
| 2008/0153267 A1 * | 6/2008 | Clavelier et al. | 438/481 |

(Continued)

FOREIGN PATENT DOCUMENTS

WO 2009110632 11/2009

OTHER PUBLICATIONS

Chen et al., "Integrated GHz silicon photonic interconnect with micrometer-scale modulators and detectors," Optics Express, vol. 17, No. 17 (Aug. 13, 2009).

(Continued)

*Primary Examiner* — Colleen Matthews
*Assistant Examiner* — Regan J Rundio
(74) *Attorney, Agent, or Firm* — McDonnell Boehnen Hulbert & Berghoff LLP

(57) ABSTRACT

Disclosed are methods for co-integration of active and passive photonic devices on a planarized silicon-based photonics substrate. In one aspect, a method is disclosed that includes providing a planarized silicon-based photonics substrate comprising a silicon waveguide structure, depositing a dielectric layer over the planarized silicon-based photonics substrate, selectively etching the dielectric layer, thereby exposing at least a portion of the silicon waveguide structure, selectively etching the exposed portion of the silicon waveguide structure to form a template, using the silicon waveguide structure as a seed layer to selectively grow in the template a germanium layer that extends above the dielectric layer, and planarizing the germanium layer to form a planarized germanium layer, wherein the planarized germanium layer does not extend above the dielectric layer.

13 Claims, 17 Drawing Sheets

(56) References Cited

U.S. PATENT DOCUMENTS

| | | |
|---|---|---|
| 2008/0193076 A1 | 8/2008 | Witzens et al. |
| 2009/0108384 A1* | 4/2009 | Assefa et al. ............... 257/432 |
| 2010/0129952 A1* | 5/2010 | Martinez et al. ............. 438/59 |
| 2012/0320939 A1* | 12/2012 | Baets et al. ............... 372/45.01 |

OTHER PUBLICATIONS

Chen et al., "High performance germanium photodetectors integrated on submicron silicon waveguides by low temperature wafer bonding," Optics Express, vol. 16, No. 15 (Jul. 17, 2008).

Park et al., "Monolithic integration and synchronous operation of germanium photodetectors and silicon variable optical attenuators," Optics Express, vol. 18, No. 8 (Apr. 6, 2010).

Sorianello et al., "Guided-wave photodetectors in germanium on optical chips in silicon-on-insulator," Journal of the European Optical Society, Rapid Publications 4, 09030 (Jun. 19, 2009).

Yu et al., "High quality single-crystal germanium-on-insulator on bulk Si substrates based on multistep lateral over growth with hydrogen annealine," Applied Physics Letters 97, 063503 (Aug. 9, 2010).

Zhechao Wang, "Investigation of New Concepts and Solutions for Silicon Nanophotonics," Doctoral Thesis in Microelectronics and Applied Physics, KTH Schoool of Information and Communication Technology at Kista, Sweden, Chapter 6 (Apr. 2010).

Kang et al., "Monolithic Ge/Si Avalanche Photodiodes," 6th IEEE International Conference on Group IV Photonics, vol. 6, Issue V (Sep. 11, 2009).

Vermeulen et al., "High-efficiency fiber-to-chip grating couplers realized using an advanced CMOS-compatible Silicon-on-Insulator platform," Optics Express, vol. 18, No. 17 (Aug. 10, 2010).

European Search Report, Patent Application No. 12167332.1 dated Sep. 28, 2012.

Michel, Jurgen et al., "High-Performance Ge-on-Si Photodetectors", Nature Photonics, vol. 4, Aug. 2010, pp. 527-534.

* cited by examiner

CO-INTEGRATION OF PHOTONIC DEVICES ON A SILICON PHOTONICS PLATFORM

CROSS-REFERENCE TO RELATED APPLICATION

This application claims priority to U.S. Provisional Patent Application Ser. No. 61/484,064 filed May 9, 2011, the contents of which are hereby incorporated by reference.

BACKGROUND

The realization of a complete silicon based photonics platform requires the co-integration of advanced passive photonic devices, e.g., using poly-on-SOI (such as, for example, high-efficiency raised grating couplers, filters, polarization rotators and/or waveguides), advanced electro-optic modulators and switches (such as, for example, semiconductor-oxide-semiconductor (SOSCAP) modulators, e.g., employing the gate-oxide capacitance between poly and SOI, and/or p-n diodes for carrier depletion and injection), hybrid III-V/Si lasers and amplifiers using bonding technology, and germanium-on-silicon (Ge-on-Si) waveguide photodetectors.

In hybrid III-V/silicon lasers and amplifiers, optical gain is achieved in a low-defect III-V layer that is first grown epitaxially on a separate substrate and then bonded to, e.g., a SOI substrate. In order to allow efficient evanescent coupling between the silicon layer and the III-V layer, both layers are in close proximity, such as at a distance less than 100 nm. Bonding of the III-V layer with thin interfacial layers requires a flat surface with a low topography.

The co-integrated germanium-on-silicon (Ge-on-Si) waveguide photodetectors preferably have a good performance, such as a low dark current, requiring a low defect density of threading dislocations (less than $10^7$ per $cm^2$); a high responsivity in the order of 1 A/W, requiring efficient optical coupling between silicon and germanium, low parasitic absorption at the metal contacts and efficient carrier collection; and a high speed, e.g., in the range between 10 GHz and 40 GHz, requiring thin layers and a small footprint.

Germanium waveguide photodetectors can, for example, be integrated with a silicon photonics platform by transferring and wafer bonding a crystalline germanium film onto a silicon based (e.g., SOI) wafer, and then fabricating the photodetector in the transferred film. However, using a wafer bonding approach is relatively expensive and makes co-integration with other opto-electronic components difficult, in particular the co-integration with hybrid III-V/silicon lasers, requiring bonding of III-V layers in close proximity to a silicon waveguide.

Germanium waveguide photodetectors can also be integrated with a silicon photonics platform by growing (e.g., epitaxially) a germanium layer on top of a silicon waveguide and then fabricating a germanium photodetector. In order to enable co-integration with other opto-electronic components and, e.g., hybrid lasers, a planar topology is needed, requiring, for example, a thin germanium film for the photodetectors (e.g., thinner than 300 nm). However, metal contacts on top of such a thin film are known to cause excessive optical absorption, which detracts from the photocurrent and, as such, negatively affects the photodetector responsivity. These negative effects are even more pronounced in a thin germanium layer epitaxially grown on top of silicon than for a thicker germanium layer.

SUMMARY

Disclosed are methods for integrating high-performance waveguide-integrated photodetectors (e.g., germanium waveguide-integrated photodetectors) with other photonic devices on a silicon photonics platform, such as a SOI based photonics platform. The photonic devices may include active and/or passive devices. Also disclosed are high-performance waveguide-integrated photodetectors obtained using the disclosed methods.

In one aspect, a method is disclosed that includes providing a planarized silicon-based photonics substrate comprising a silicon waveguide structure, depositing a dielectric layer over the planarized silicon-based photonics substrate, selectively etching the dielectric layer, thereby exposing at least a portion of the silicon waveguide structure, selectively etching the exposed portion of the silicon waveguide structure to form a template, using the silicon waveguide structure as a seed layer to selectively grow in the template a germanium layer that extends above the dielectric layer, and planarizing the germanium layer to form a planarized germanium layer, wherein the planarized germanium layer does not extend above the dielectric layer.

In some embodiments, the dielectric layer comprises an oxide layer, such as a $SiO_2$ layer.

In some embodiments, the method further includes, before planarizing the germanium layer, annealing the germanium layer.

In some embodiments, the planarized germanium layer has a thickness between about 100 nm and about 500 nm.

In some embodiments, planarizing the germanium layer comprises using a chemical mechanical polish to planarize the germanium layer.

In some embodiments, as a result of the template, the planarized germanium layer has an inverted rib shape. In these embodiments, the method may further include forming a germanium photodetector structure comprising the planarized germanium layer. The inverted rib shape may comprise an optically-active region and laterally-overhanging portions on either side of the optically-active region. In some embodiments, the optically-active region has a thickness between about 250 nm and about 300 nm. In some embodiments, the method may further include providing metal contacts in electrical contact with the laterally-overhanging portions.

In another aspect, a method is disclosed that includes providing a planarized silicon-based photonics substrate comprising a first silicon waveguide structure and a second silicon waveguide structure, depositing a dielectric layer over the planarized silicon-based photonics substrate, and selectively etching the dielectric layer, thereby exposing at least a portion of the first silicon waveguide structure and at least a portion of the second silicon waveguide structure. The method further includes selectively etching the exposed portion of the first silicon waveguide structure to form a first template, selectively etching the exposed portion of the second silicon waveguide structure to form a second template, using the first silicon waveguide structure as a first seed layer to selectively grow in the first template a first germanium layer that extends above the dielectric layer, and planarizing the first germanium layer to form a first planarized germanium layer, wherein the first planarized germanium layer does not extend above the dielectric layer. The method further includes using the second silicon waveguide structure as a seed layer to selectively grow in the second template a second germanium layer that extends above the dielectric layer and planarizing the second germanium layer to form a second planarized germanium layer, wherein the planarized germanium layer does not extend above the dielectric layer.

In some embodiments, as a result of the first template, the first planarized germanium layer has an inverted rib shape.

Similarly, in some embodiments, as a result of the second template, the second planarized germanium layer has a laterally overgrown shape. In these embodiments, the method may further include forming a first germanium photodetector structure comprising the first planarized germanium layer and forming a second germanium photodetector structure comprising the second planarized germanium layer. The inverted rib shape may comprise an optically-active region and laterally-overhanging portions on either side of the optically-active region. Further, the laterally overgrown shape may comprise an optically-active region and a laterally-overhanging portion on one side of the optically-active region, wherein the laterally-overhanging portion is laterally disposed from the second silicon waveguide structure by at least about 300 nm.

In some embodiments, the method further includes, in a single processing step, forming contacts to the first silicon waveguide structure, the second silicon waveguide structure, the first germanium photodetector structure, and the second germanium photodetector structure.

In yet another aspect, a method is disclosed that includes providing a planarized silicon-based photonics substrate comprising a first silicon waveguide structure and a second silicon waveguide structure, depositing a dielectric layer over the planarized silicon-based photonics substrate, and selectively etching the dielectric layer, thereby exposing at least a portion of the first silicon waveguide structure. The method further includes selectively etching the exposed portion of the first silicon waveguide structure to form a template, using the first silicon waveguide structure as a seed layer to selectively grow in the template a germanium layer that extends above the dielectric layer, and planarizing the germanium layer to form a planarized germanium layer, wherein the planarized germanium layer does not extend above the dielectric layer. The method still further includes forming a germanium photodetector structure comprising the first planarized germanium layer, bonding a III-V layer to the dielectric layer at a distance of less than about 100 nm from the second silicon waveguide structure, and integrating a hybrid laser structure with the planarized silicon-based photonics substrate, wherein the hybrid laser structure comprises the III-V layer.

In some embodiments, as a result of the first template, the first planarized germanium layer has an inverted rib shape.

In some embodiments, the method further includes, in a single processing step, forming contacts to the first silicon waveguide structure, the second silicon waveguide structure, the germanium photodetector structure, and the hybrid laser structure.

For purposes of summarizing the disclosure and the advantages achieved over the prior art, certain objects and advantages of the disclosure have been described herein above. Of course, it is to be understood that not necessarily all such objects or advantages may be achieved in accordance with any particular embodiment of the disclosure. Thus, for example, those skilled in the art will recognize that the disclosure may be embodied or carried out in a manner that achieves or optimizes one advantage or group of advantages as taught herein without necessarily achieving other objects or advantages as may be taught or suggested herein. Further, it is understood that this summary is merely an example and is not intended to limit the scope of the disclosure as claimed. The disclosure, both as to organization and method of operation, together with features and advantages thereof, may best be understood by reference to the following detailed description when read in conjunction with the accompanying drawings.

Figure 1:
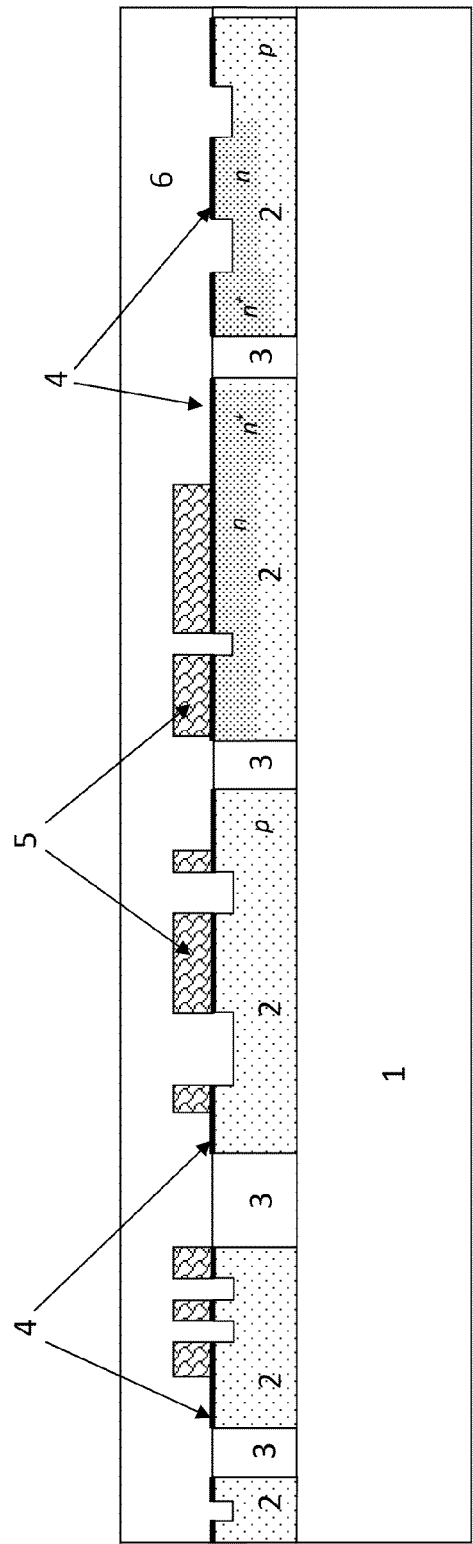
FIGS. 1-8 schematically illustrate process steps of an example method, in accordance with some embodiments.

Any reference signs in the claims shall not be construed as limiting the scope of the present disclosure. In the different drawings, the same reference signs typically refer to the same or analogous elements, unless context dictates otherwise.

DETAILED DESCRIPTION

In the following detailed description, numerous specific details are set forth in order to provide a thorough understanding of the disclosure and how it may be practiced in particular embodiments. However, it will be understood that the present disclosure may be practiced without these specific details. In other instances, well-known methods, procedures and techniques have not been described in detail, so as not to obscure the present disclosure. While the present disclosure will be described with respect to particular embodiments and with reference to certain drawings, the disclosure is not limited hereto. The drawings included and described herein are schematic and are not limiting the scope of the disclosure. It is also noted that in the drawings, the size of some elements may be exaggerated and, therefore, not drawn to scale for illustrative purposes.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

The present disclosure provides an integration process that allows for the co-integration of photonic active and passive devices and high-performance waveguide-integrated photodetectors, such as high-performance germanium waveguide-integrated photodetectors, on a single silicon based photonics platform. The present disclosure further provides an integration process that allows for the hybrid integration of light sources, such as hybrid III-V/Si lasers, on a single silicon based photonics platform.

In one aspect, an example method is disclosed that includes providing a planarized silicon-based photonics substrate comprising a first silicon waveguide structure and a second silicon waveguide structure. Thereafter, a dielectric layer may be deposited over the planarized silicon-based photonics substrate, and at least a portion of the first silicon waveguide structure may be exposed (e.g., by forming a trench over the first silicon waveguide structure). The method further includes selectively etching the exposed portion of the first silicon waveguide structure to form a template, using the first silicon waveguide structure as a seed layer to selectively grow a germanium layer that extends above the dielectric layer, and planarizing the germanium layer to form a planarized germanium layer, wherein the planarized germanium layer does not extend above the dielectric layer. The planarized germanium layer may, for example, have a thickness between about 250 nm and about 300 nm. In some embodiments, the planarized germanium layer may thereafter be doped (e.g., by implantation) and/or annealed.

In some embodiments, the template may be selected such that it allows fabricating a thin germanium photodetector. The resulting germanium photodetector may, for example, exhibit high responsivity, a low dark current, and a high speed. To this end, metal contacts to the germanium photodetector may be provided at a distance from the optically active region of the germanium photodetector. This is obtained by selecting a template that results in an 'inverted rib' germanium photodetector. As a result of the template, the germanium layer may be patterned such that it comprises an optically-active region (which may, for example, be 100 nm to 500 nm thick, or even 250 nm to 300 nm thick) and laterally-overhanging portions (which may, for example, be about 50 nm thick), resulting in an 'inverted rib' or 'T' shape. The metal contacts may be provided on the laterally-overhanging portions. The laterally-overhanging portions may be thin in order to confine the optical mode to the thicker optically-active region. In confining the optical mode to the optically-active region, absorption losses at the contacts may be limited.

In some embodiments, in order to additionally minimize the influence of defects in the first germanium layer grown on top of the first silicon waveguide structure, a 'laterally overgrown' germanium waveguide-integrated photodetector may be provided over the second silicon waveguide structure. In these embodiments, the optically-active germanium region may be formed by lateral overgrowth over the second silicon waveguide structure, with a thin (e.g., less than 100 nm) dielectric layer in between the laterally-overgrown germanium layer and the second silicon waveguide structure. The optically-active region of the germanium layer may be at a predetermined lateral distance from the seed layer. In addition, the metal contacts may be provided at a distance from the optically active region to minimize absorption losses at the metal contacts, as described above.

Each of the 'inverted rib' germanium structure and the 'laterally overgrown' germanium structure described above may be formed by selective germanium growth seeded from silicon (of a silicon waveguide structure) at the bottom of an oxide trench with an appropriate etch depth and profile. As described above, the trench thereby forms a template for the germanium growth and an etched silicon waveguide structure is used as a seed layer.

After integration of the germanium photodetectors, a planar structure is obtained. Thereafter, in some embodiments, III-V layers can be bonded to this planar structure, e.g., for fabricating integrated III-V/silicon hybrid lasers. After laser processing, a common BEOL (Back-End Of Line) approach can be used to contact the lasers, germanium photodetectors, and silicon waveguide structures.

The disclosed methods fit within an existing framework or platform for silicon photonics processing. The disclosed methods are complementary metal-oxide-semiconductor (CMOS) compatible and allow obtaining good germanium photodetectors combined with the integration of III-V/Si lasers. After the integration of the germanium photodetectors, a planar topology is obtained, with only a thin dielectric layer (e.g., with a thickness less than 100 nm, or even less than 50 nm) on top of the silicon waveguide structures. This allows subsequent integration of hybrid III-V/Si lasers, which rely on a thin interfacial dielectric layer between the silicon and the III-V layers to obtain optimum lasing performance. In some embodiments, sharing of the contact module between all devices (lasers, germanium photodetectors, and silicon waveguide structures) is enabled, potentially leading to a low cost process.

The method of the present disclosure is further described for an exemplary process flow, with a focus on the process steps for forming the germanium photodetectors. However, the present disclosure is not limited thereto. For example, in the different process steps other suitable materials, other suitable process parameters (such as temperatures, process times, . . . ) and other suitable dimensions can be used. Other devices than the ones illustrated can be integrated.

FIGS. 1-8 schematically illustrate process steps of an example method, in accordance with some embodiments. In particular, as shown in FIGS. 1-8, a waveguide/grating coupler (FC), a raised grating coupler (RFC), a germanium-on-silicon photodetector (Ge-on-Si PD), a silicon MOSCAP modulator, and a silicon diode modulator are integrated on a silicon-based photonics platform.

As shown in FIG. 1, a planarized silicon-based photonics substrate is provided. In some embodiments, the substrate may comprise a silicon substrate, such as a silicon on insulator (SOI) substrate. The SOI wafer may include a buried oxide (BOX) layer 1. In some embodiments, the BOX layer 1 may have a thickness of, for example, about 2000 nm. Further, in some embodiments, the BOX layer 1 may be lightly p-doped.

A number of silicon waveguide structures 2 may be formed on top of the BOX layer 1. The silicon waveguide structures 2 may, for example, be formed of a patterned silicon layer. The silicon waveguide structures 2 may have a thickness of, for example, about 220 nm and, in some embodiments, may be selectively doped.

Additionally, oxide regions 3 may be formed between the silicon waveguide structures 2. A gate oxide 4, a polycrystalline layer 5, and an oxide layer 6 may be formed on the silicon waveguide structures 2 and the oxide regions 3 and may be planarized to achieve a planar surface.

In some embodiments, the example planarized silicon-based photonics substrate shown in FIG. 1 may be processed according to a typical silicon photonics platform, such as that described by D. Vermeulen et al. ("High-efficiency fiber-to-chip grating couplers realized using an advanced CMOS-compatible Silicon-On-Insulator platform," Optics Express, Vol. 18 No. 17, 16 Aug. 2010, pp 18278-18283.) The example planarized silicon-based photonics substrate may be processed in other manners as well.

Figure 2:
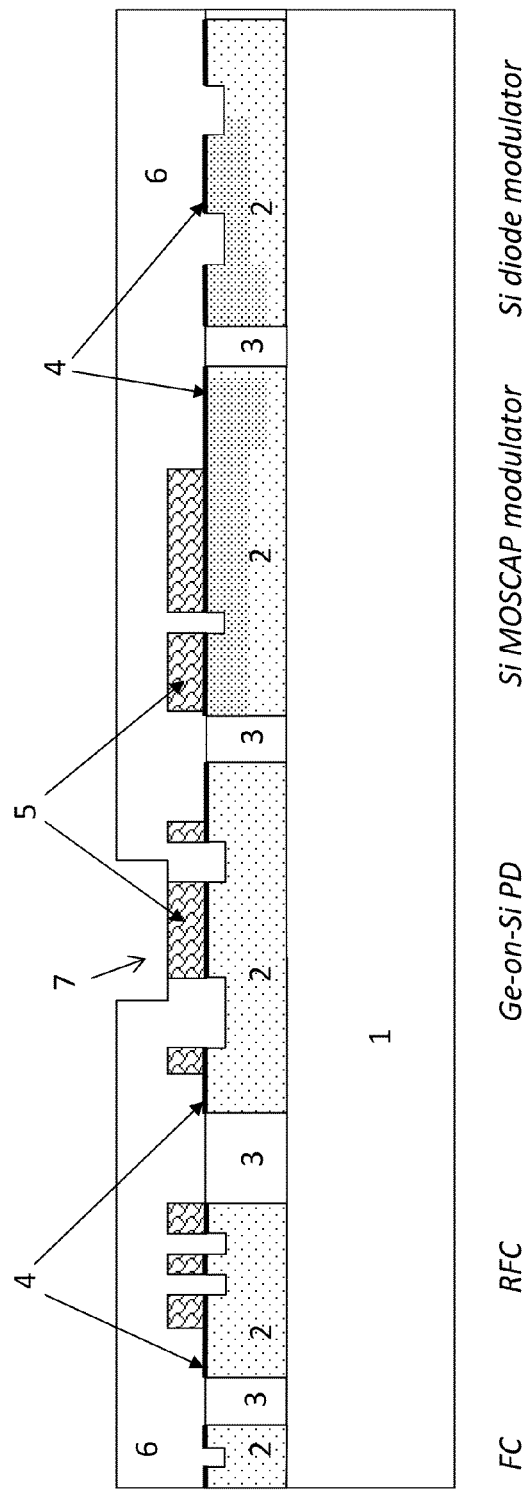
Figure 3:
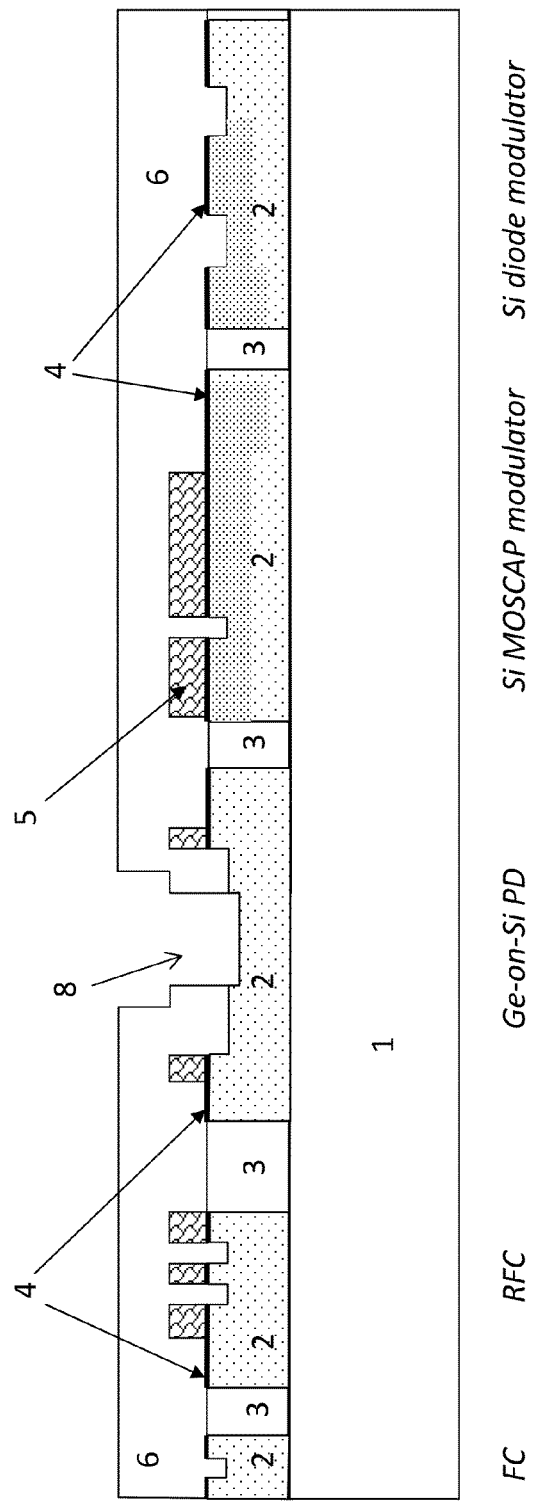

FIGS. 2-3 illustrate formation of a template 8 to be used in growing a germanium layer 9. As shown in FIG. 2, a trench 7 may be etched in the oxide layer 6, thereby exposing a portion of the polycrystalline layer 5. Further, as shown in FIG. 3, the exposed portion of the polycrystalline layer 5 may be etched (e.g., stopping on the gate oxide 4). Further, the gate oxide 4 may be etched. In some embodiments, any photoresist (e.g., used for the patterning steps) may be removed after the polycrystalline layer 5 is etched and before the oxide layer 6 is etched, without exposing the patterned silicon layer 2. Still further, a portion of a silicon waveguide structure 2 may be etched (e.g., to a depth between about 70 nm and about 150 nm), thereby forming the template 8. As shown, following the etches, a portion of the silicon waveguide structure 2 may be exposed.

Once the template 8 is formed, the planarized silicon-based photonics substrate may be cleaned, followed by an HF dip and an in-situ $H_2$ bake at 850° C. Then, an in-situ etch (e.g., an HCl vapor etch of about 50 nm) of the silicon waveguide structure 2 may be performed in order to have a good seed layer surface.

Figure 4:
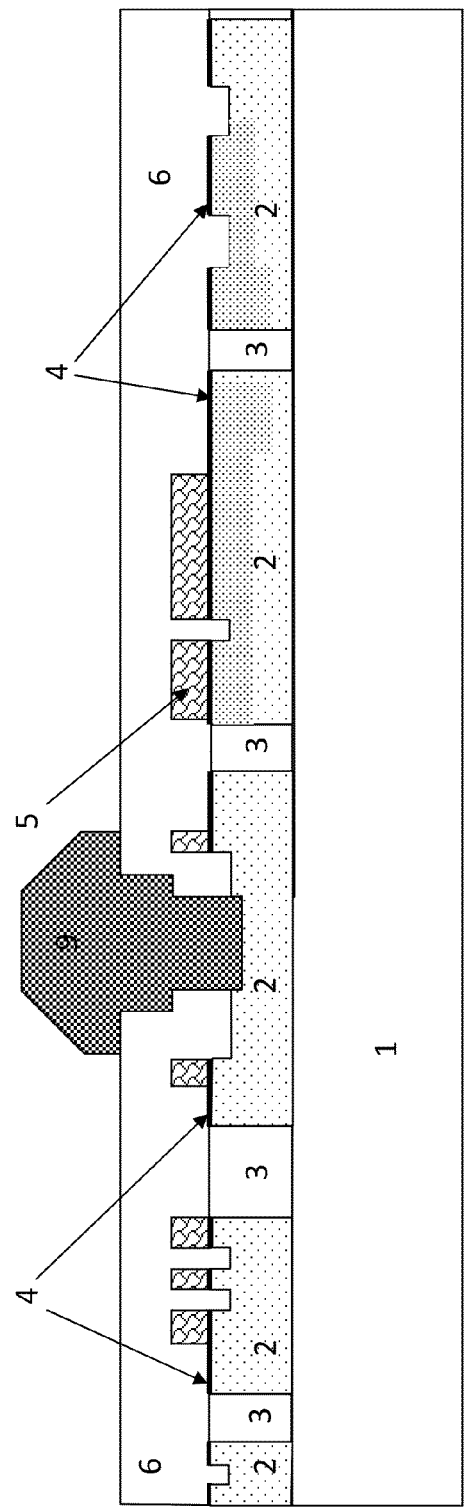

FIG. 4 illustrates the selective growth of a germanium layer 9 in the template 8. As shown in FIG. 4, the exposed portion of the first silicon waveguide structure 2 may be used as a seed layer for the selective growth of the germanium layer 9. The germanium layer 9 may be formed with a thickness on the order of, for example, about 1 μm to about 2 μm. In some embodiments, additional silicon epitaxial growth and/or in-situ doping may be performed.

Following the selective growth of the germanium layer 9, the germanium layer 9 may be annealed. The anneal may be, for example, a 3 minute anneal at 850° C. in a nitrogen atmosphere. Other anneals are possible as well. In general, the anneal may serve to reduce a number of defects in the germanium layer 9.

Figure 5:
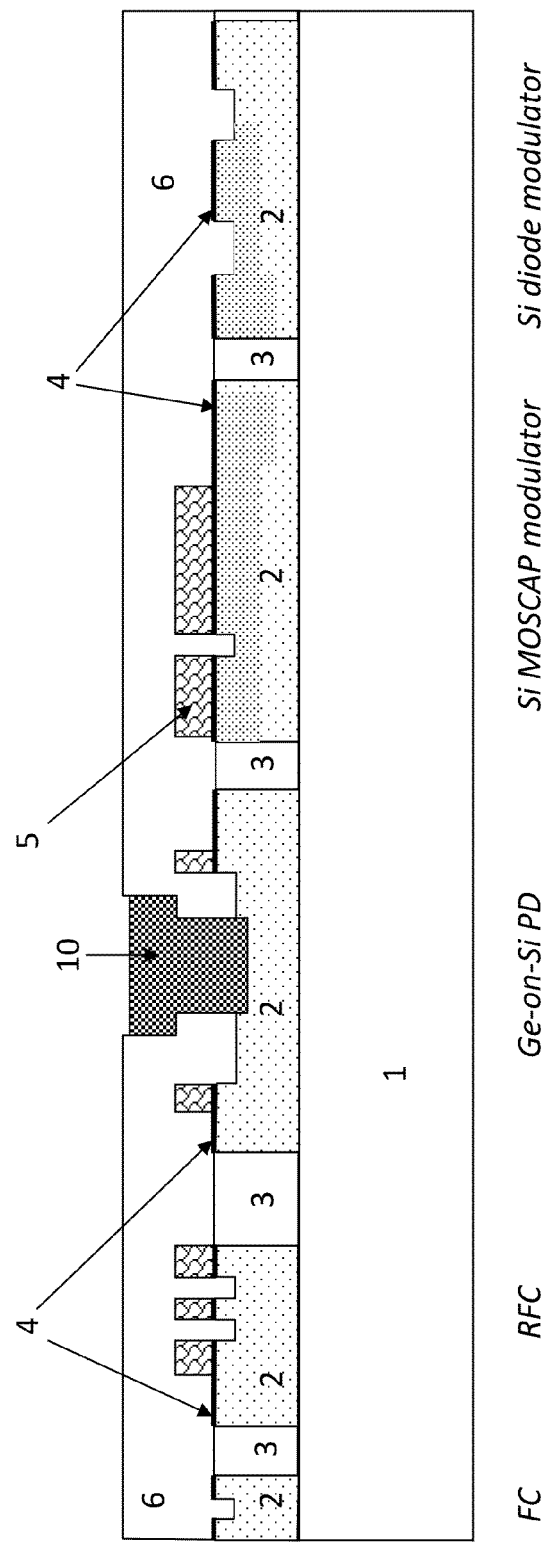

As shown in FIG. 5, a chemical mechanical polish (CMP) may be used to planarize the germanium layer 9, thereby forming a planarized germanium layer 10. The CMP may, for example, stop at the oxide layer 6. In some embodiments, in order to better control the CMP process, germanium-based dummy structures or germanium dummies can be provided that level out the density of germanium over the substrate. These germanium dummies can, for example, be formed at the location of any silicon-based dummy structures used in the fabrication process of the planarized silicon-based photonics substrate shown in FIG. 1. For example, the germanium dummies can be fabricated using the silicon-based dummy structures as a seed layer for germanium growth. Following the CMP, the planarized germanium layer 10 may have a thickness between about 100 nm and about 500 nm, such as between about 250 nm and about 300 nm.

Figure 6:
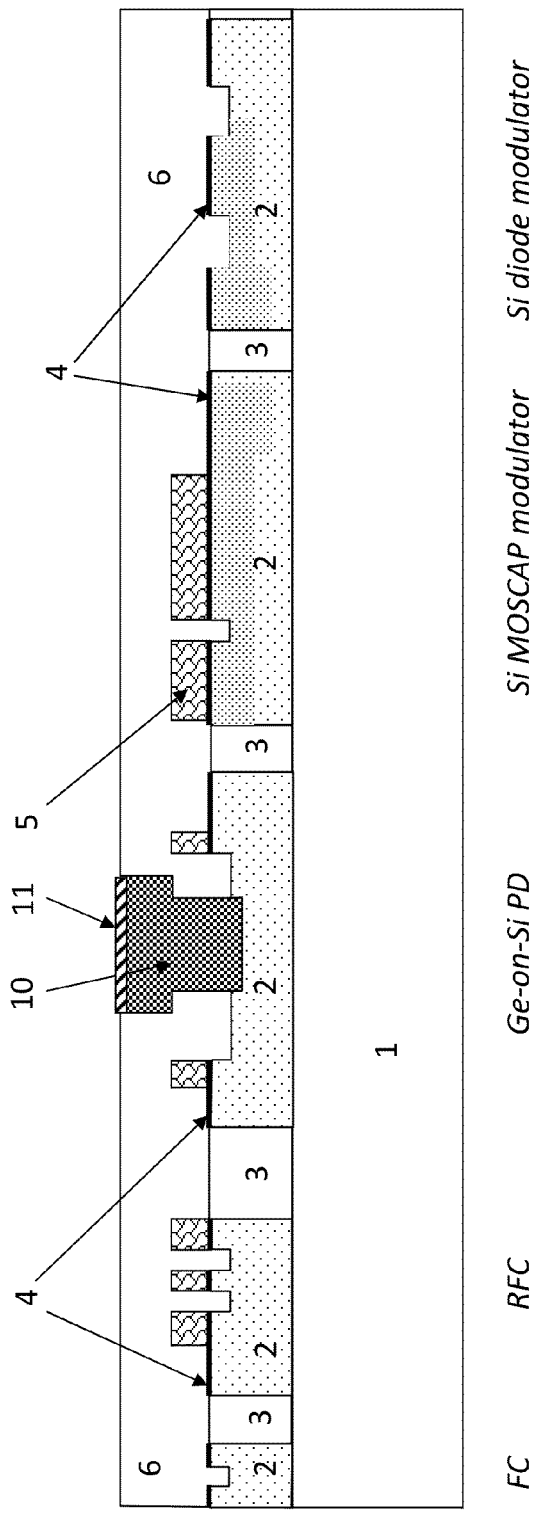

In FIG. 6, a cap layer 11 may be formed on the planarized germanium layer 10. The cap layer 11 may, for example, have a thickness of about 20 nm. Further, the cap layer 11 may be formed of, for example, $Si_{0.50}Ge_{0.50}$ cap 11. The cap layer 11 may, for example, be formed selectively with respect to the oxide layer 6. Further, the cap layer 11 may enable (in a later process step) a collective silicidation with the silicon devices.

Figure 7:
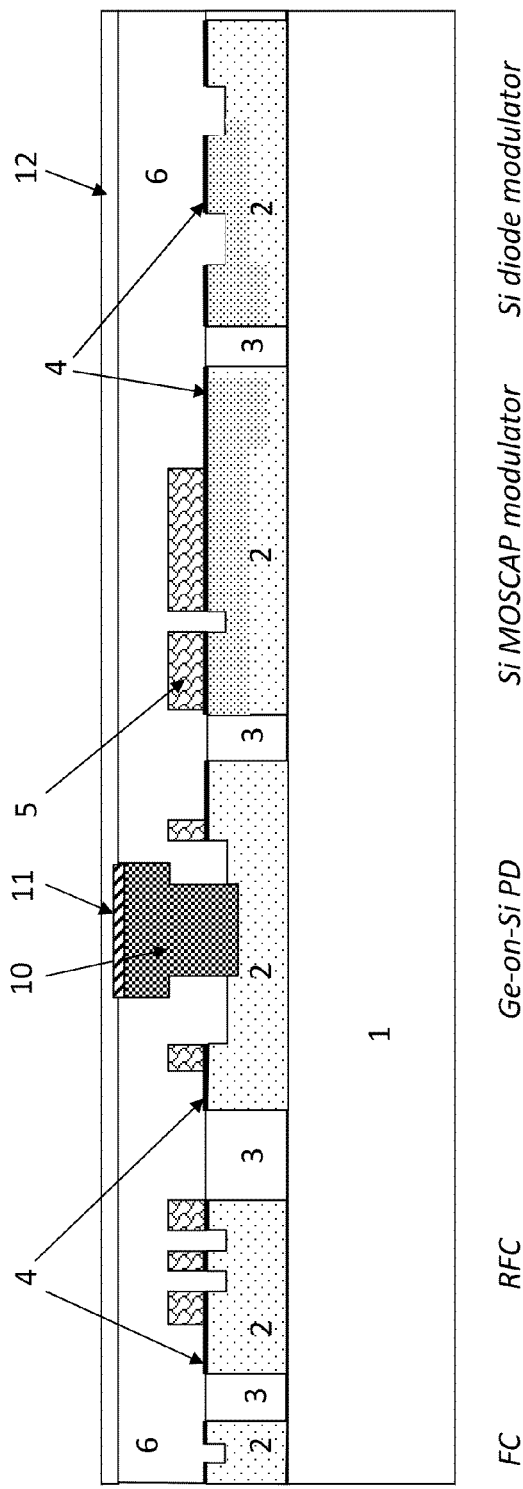
Figure 8:
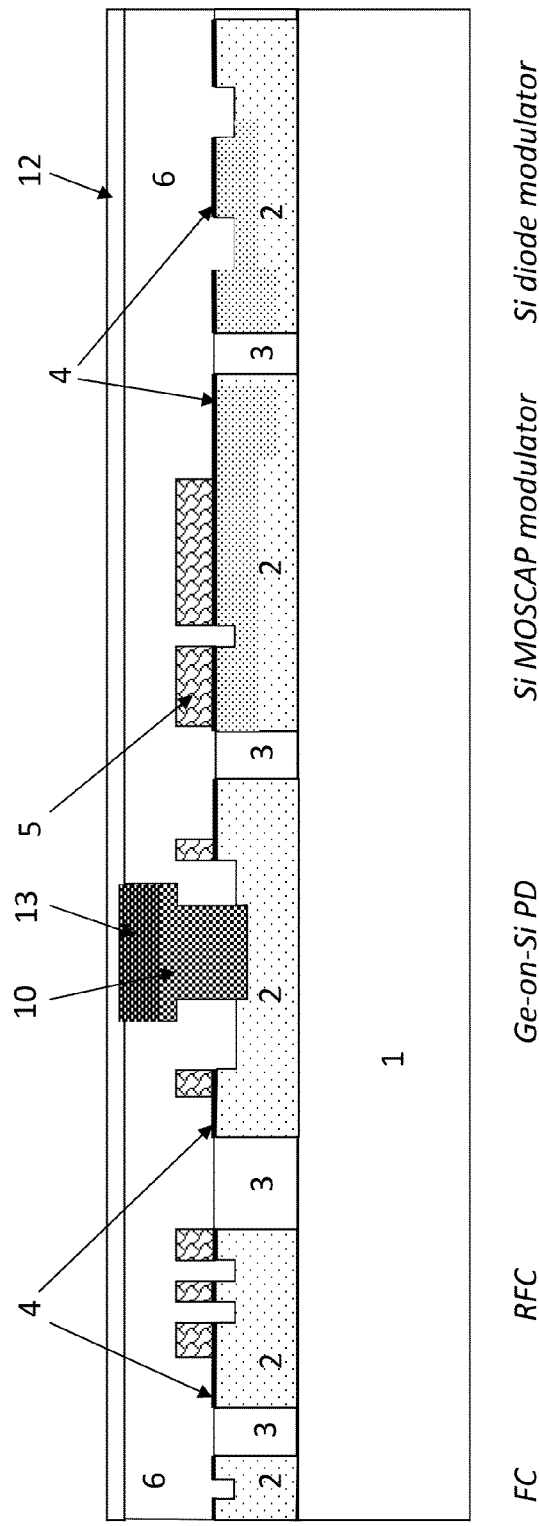
Figure 10:
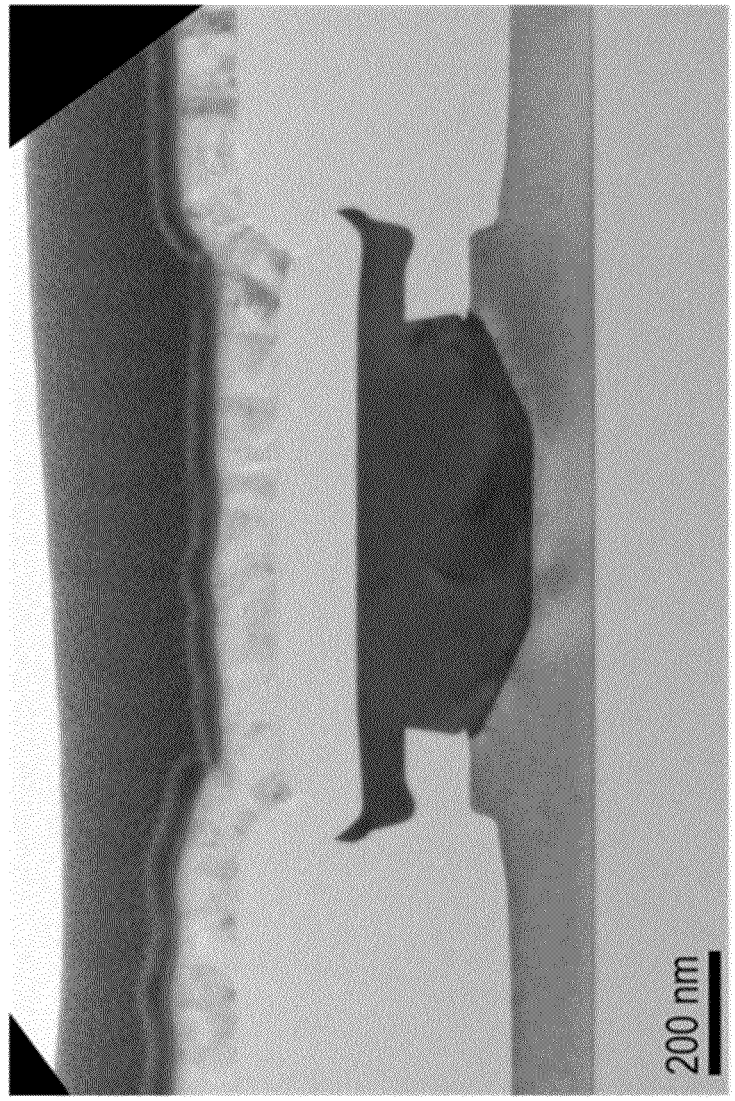
FIG. 10 shows a transmission electron microscopy image showing a cross-section of an 'inverted rib' germanium structure, in accordance with some embodiments.

FIG. 7 illustrates the growth of an oxide liner 12. The oxide liner 12 may, for example, be formed using plasma-enhanced chemical vapor deposition (PECVD). Further, the oxide liner 12 may, for example, have a thickness less than 100 nm, less than 50 nm, or even less than about 30 nm. Thereafter, as shown in FIG. 8, dopants 13 may be implanted in the planarized germanium layer 10. The dopants may be, for example, n+ dopants, such as phosphorous, and/or p+ dopants, such as boron. Other dopants 13 are possible as well. After the dopants 13 are implanted in the planarized germanium layer 10, an activation anneal may be performed, thereby forming a germanium photodetector structure (e.g., the vertical p-i-n structure in the example shown in FIG. 8). As shown in FIG. 8, the germanium photodetector structure has an 'inverted rib' structure. A transmission electron microscopy (TEM) image showing a cross-section of such an 'inverted rib' structure is shown in FIG. 10.

At this stage of the process, a planar structure comprising silicon waveguide structures and an integrated germanium photodetector is obtained. The oxide liner 12 may be thin (e.g., less than 100 nm thick), allowing further integration of, for example, III-V/Si hybrid lasers with good coupling to the underlying silicon photonics structures.

Figure 9:
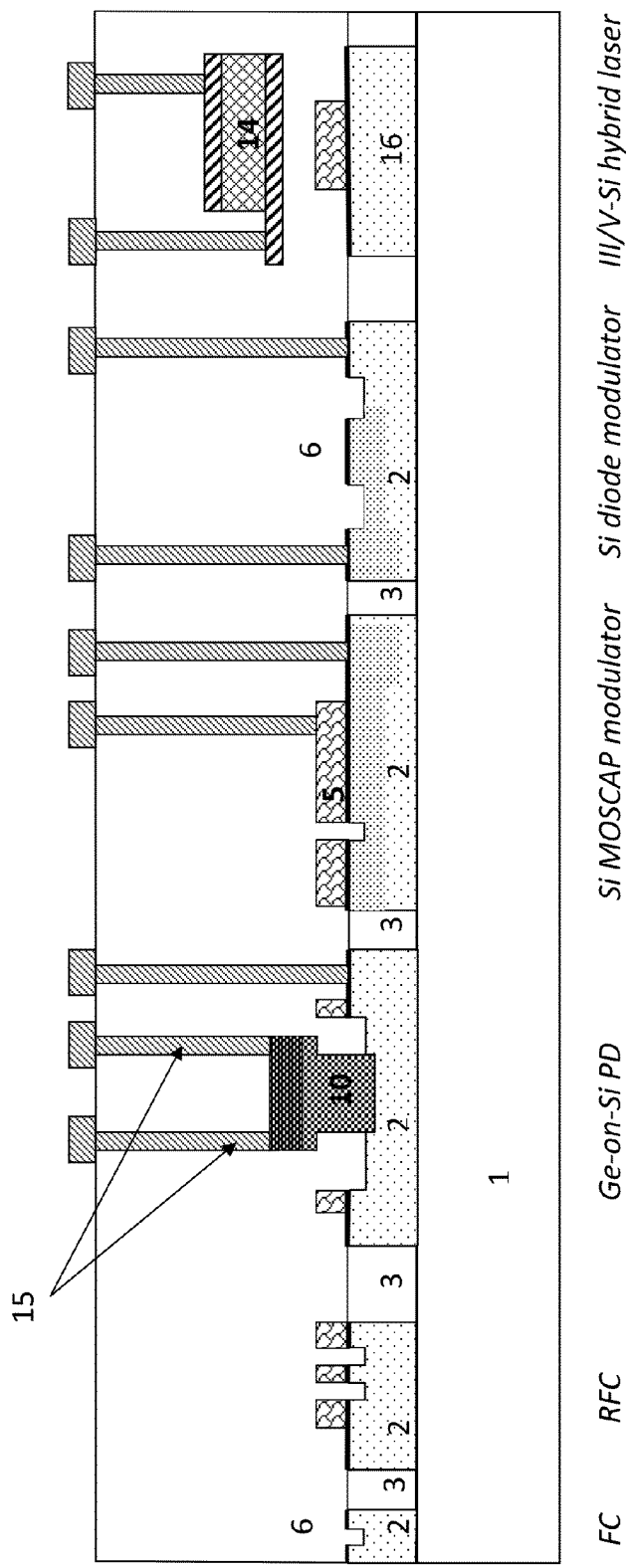
FIG. 9 illustrates the integration of a hybrid III-V/silicon laser, in accordance with some embodiments.

Integration of a III-V device is schematically illustrated in FIG. 9. As shown in FIG. 9, an integrated III-V layer 14 may be formed that allows good optical coupling to an underlying silicon waveguide structure 16. Further process steps, after bonding of the III-V layer, are mainly related to laser processing and forming contacts and interconnects. In some embodiments, a single contact module can be used for forming the contacts to the silicon devices, germanium photodetectors, and hybrid lasers. As shown in FIG. 9, the planarized germanium layer 10 has an 'inverted rib' structure comprising thin laterally overhanging elements on which metal contacts 15 may be provided.

Figure 11A:
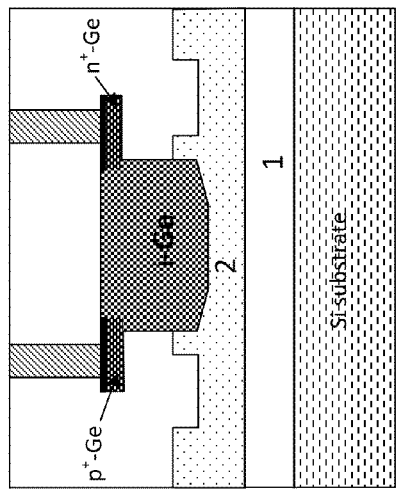
FIGS. 11A-11C illustrates different device configurations for an 'inverted rib' germanium photodetector, in accordance with some embodiments.
Figure 11B:
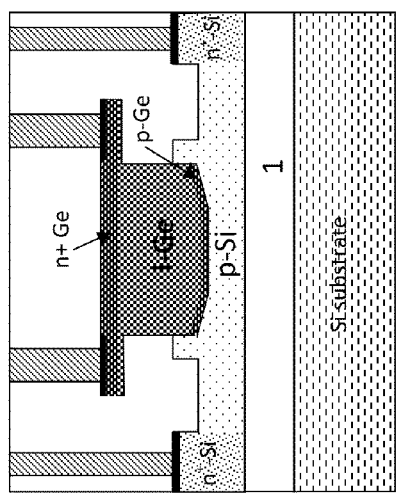
Figure 11C:
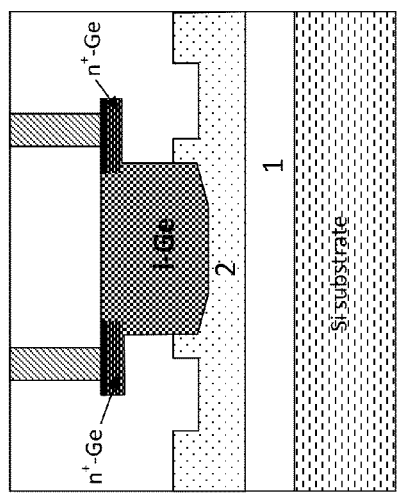

This is also illustrated in FIGS. 11A-C for different electrical design variants of the germanium photodetector. In particular, FIG. 11A illustrates a vertical p-i-n structure, FIG. 11B illustrates a lateral p-i-n structure, and FIG. 11C illustrates a lateral Metal-Semiconductor-Metal structure. As shown, the metal contacts are provided on the thin laterally overhanging parts of the germanium structure, away from the optically active region such that optical losses at the metal contacts are strongly reduced, leading to a high responsivity of the germanium photodetector.

Figure 12A:
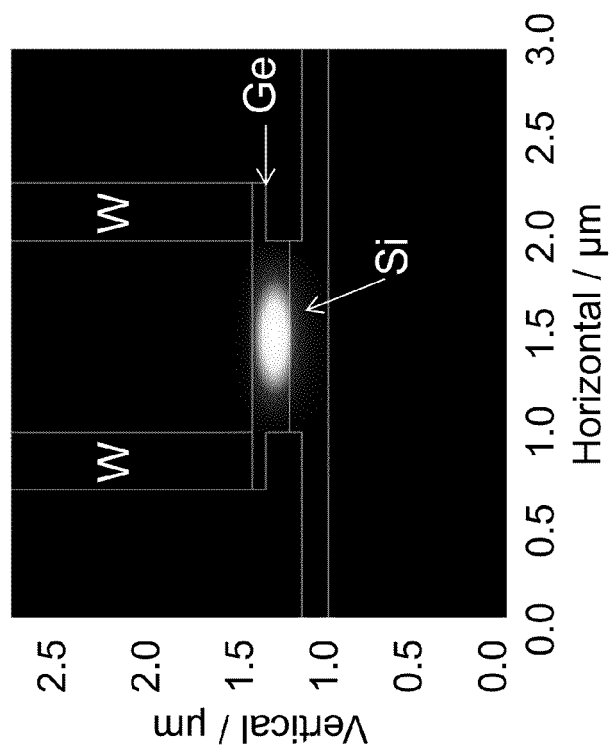
FIGS. 12A-12B show simulation results for a typical germanium photodetector (12B) and for an 'inverted rib' germanium photodetector (12A), in accordance with some embodiments.
Figure 12B:
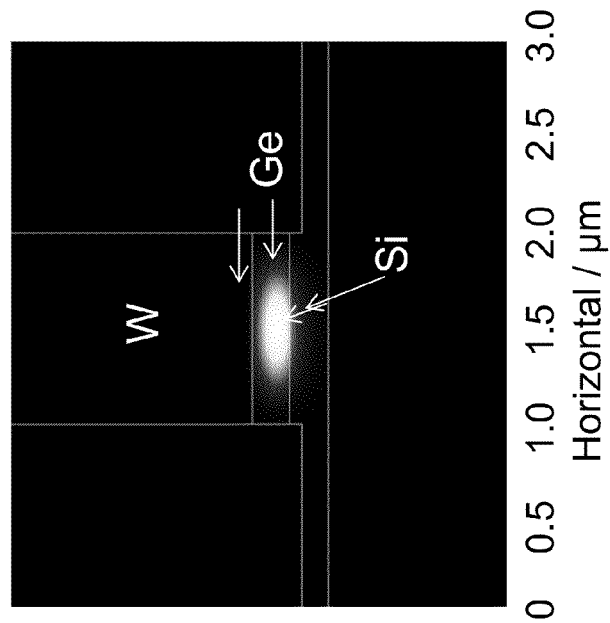

FIGS. 12A-B show results of simulations performed for a typical germanium waveguide-integrated photodetector with a metal contact on top of the optically active region of the germanium photodetector and for an 'inverted rib' germanium photodetector, such as that described above. Simulations were performed at a wavelength of 1.5 micrometer, assuming a germanium waveguide that is 1 micrometer wide and 0.21 micrometer thick. The simulations revealed that in the case of an 'inverted rib' germanium photodetector the absorption coefficient of the optical mode is about 4400/cm and that absorption mainly occurs in the germanium, leading to a maximum quantum efficiency approaching 100%. In case of the typical germanium photodetector, the simulation shows that the absorption coefficient of the optical mode is about 7400/cm, of which about 3000/cm is related to absorption in the metal, resulting in a maximum quantum efficiency of less than 60%.

Figure 13A:
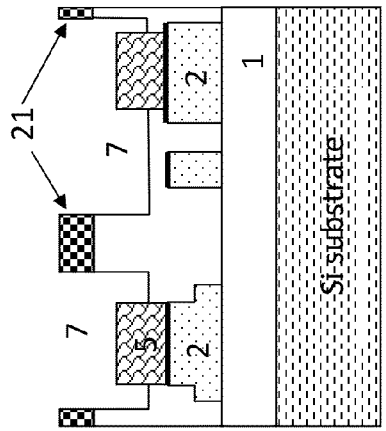
FIGS. 13A-13H schematically illustrate process steps of an example method, in accordance with some embodiments.

FIGS. 13A-H schematically illustrate a fabrication process for forming an 'inverted rib' germanium photodetector and a 'laterally overgrown' germanium photodetector. As shown in FIG. 13A, a planarized silicon-based photonics substrate is provided. To this end, a silicon substrate may be provided that includes a stack of a silicon substrate and an insulator layer 1. In some embodiments, the silicon substrate may, for example, have a thickness of about 220 nm of silicon, and the insulator layer may, for example, be a buried oxide (BOX) layer and may, for example, have a thickness of about 2 μm. Further, as shown, silicon waveguide structures 2, including a first silicon waveguide structure and a second silicon waveguide structure, a gate oxide 4, and a polycrystalline layer 5 are formed on the silicon substrate and the insulator layer 1. In some embodiments, the gate oxide 4 may have a thickness of about 5 nm. Further, in some embodiments, the polycrystalline layer 5 may have a thickness of about 160 nm. Four or five levels of patterning have typically been performed, comprising for instance lithography and/or etching of polycrystalline silicon/silicon etching, to define advanced optical features or structures in the silicon. In some embodiments, an oxide may be deposited and planarized, for instance by CMP. This CMP step can be stopped at a SiN layer on top of the patterned polycrystalline silicon. In some embodiments, dummy polycrystalline silicon structures covered with SiN may be provided across the substrate to level out the density of polycrystalline silicon structures across the wafer, thus allowing good CMP process control. After the CMP, the SiN layer may be removed and the oxide in between the SiN structures may be etched back to form a planar surface. Thereafter, an oxide layer 6 may be deposited on the entire surface. The oxide layer 6 may, for example, have a thickness of about 150 nm. The resulting planarized silicon-based photonics substrate may be similar to that shown in FIG. 1.

FIG. 13A shows a stage of the process just before a template in the oxide layer 6 is formed. As shown in FIG. 13A, a patterned resist layer 21 is patterned. The patterned resist layer 21 may be used along with, for example, lithography techniques to define the template.

Figure 13B:
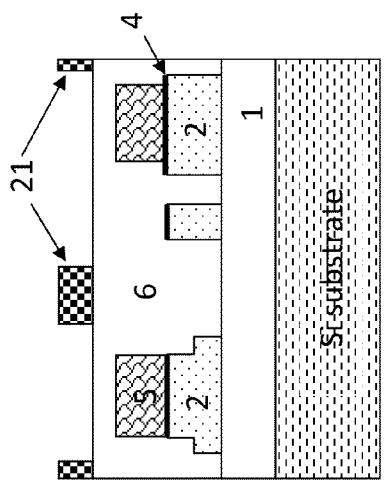

As shown in FIG. 13B, trenches 7 may be etched through the oxide layer 6, thereby exposing two portions of the underlying polycrystalline layer 5. In some embodiments, a timed oxide etch may be used to form the trenches 7, in which the etch time determines remaining thickness the oxide 6 top of the silicon waveguide structures 2. In the example shown, the trench 7 at the left is shaped to realize an 'inverted rib' germanium photodetector structure over a first silicon waveguide structure 2, while the trench 7 at the right is shaped to realize a 'laterally overgrown' germanium photodetector structure over a second silicon waveguide structure 2.

Figure 13C:
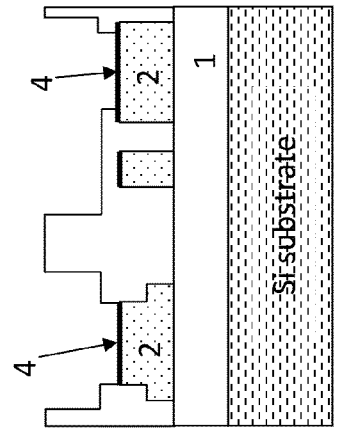
Figure 13D:
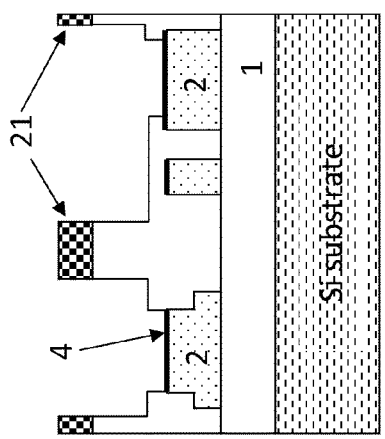
Figure 13E:
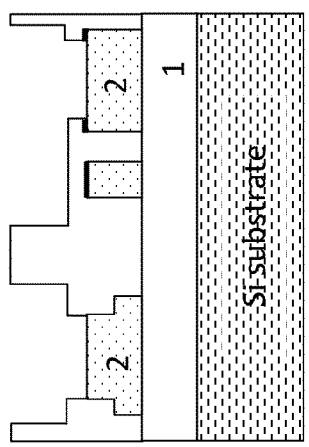
Figure 13F:
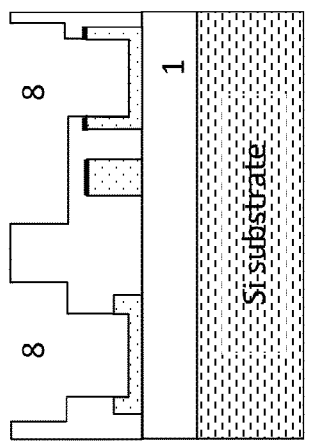

As shown in FIG. 13C, the portions of the polycrystalline layer 5 are etched through (e.g., stopping at the gate oxide 4), resulting in two step-like templates in the gate oxide 4 over the underlying silicon waveguide structures 2. After stripping the resist layer, as shown in FIG. 13D, the gate oxide 4 may be selectively etched, as shown in FIG. 13E, followed by in-situ cleaning and optional etching into the silicon waveguide structures 2 (e.g., to a depth in the range between about 70 nm and about 150 nm), as shown in FIG. 13F. As a result, a first template 8 having an inverted rib shape may be formed over the first silicon waveguide structure, while a second template 8 having a laterally overgrown shape may be formed over the second silicon waveguide structure.

Figure 13G:
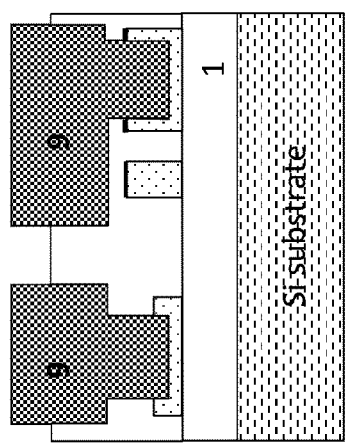

Thereafter, a germanium layer 9 may be selectively grown using the exposed silicon waveguide structures 2 as a seed layer and using the step-shaped trenches in the oxide layer 6 as a template, as shown in FIG. 13G. In particular, a first germanium layer 9 may be grown using the first silicon waveguide structure as a seed layer, and a second germanium layer 9 may be grown using the second silicon waveguide structure as a seed layer.

Figure 13H:
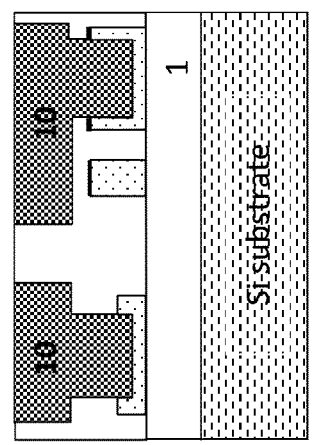

The germanium layer 9 may have a thickness between, for example, about 0.5 μm and about 5 μm. In some embodiments, the germanium layer 9 may be annealed to remove dislocation defects. Thereafter, a CMP may be performed on the germanium layer 9 to produce a planarized germanium layer 10, as shown in FIG. 13H. The planarized germanium layer 10 may have a thickness between, for example, about 100 nm and about 500 nm, such as about 300 nm.

As shown, both an 'inverted rib' structure (left) and a 'laterally overgrown' structure (right) are obtained. The CMP process control requires equal density of germanium islands across the wafer, which, in some embodiments, can be obtained by providing germanium dummy structures across the wafer.

Figure 14:
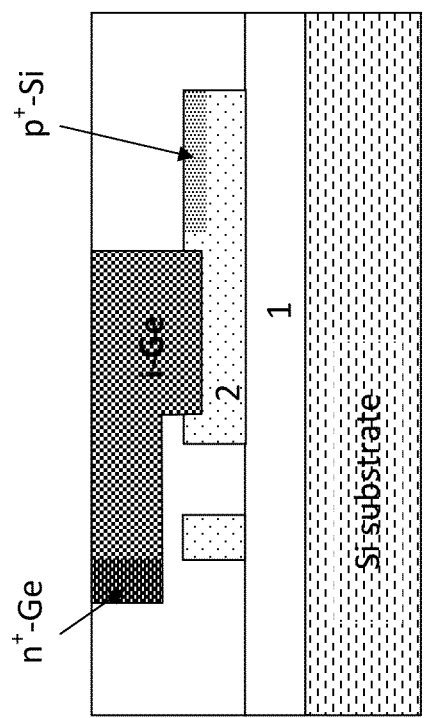
FIG. 14 illustrates different device configurations for a 'laterally overgrown' germanium photodetector, in accordance with some embodiments.
Figure 14:
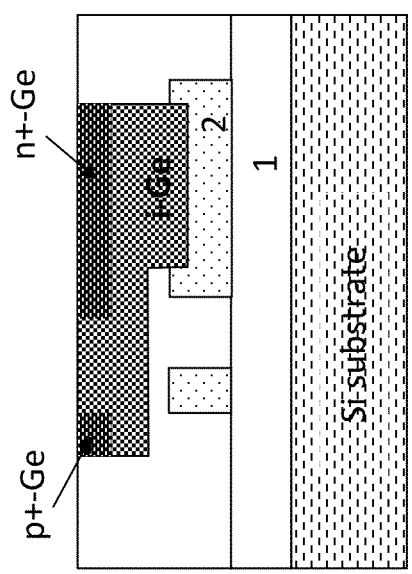

A single, common back-end-of-line (BEOL) contacting process or strategy can be performed for germanium devices and silicon optical devices on the same substrate. As an example, FIG. 14 illustrates two different device configurations that may be used for the 'laterally overgrown' germanium waveguide-integrated photodetector. Other device configurations are possible as well.

Figure 15:
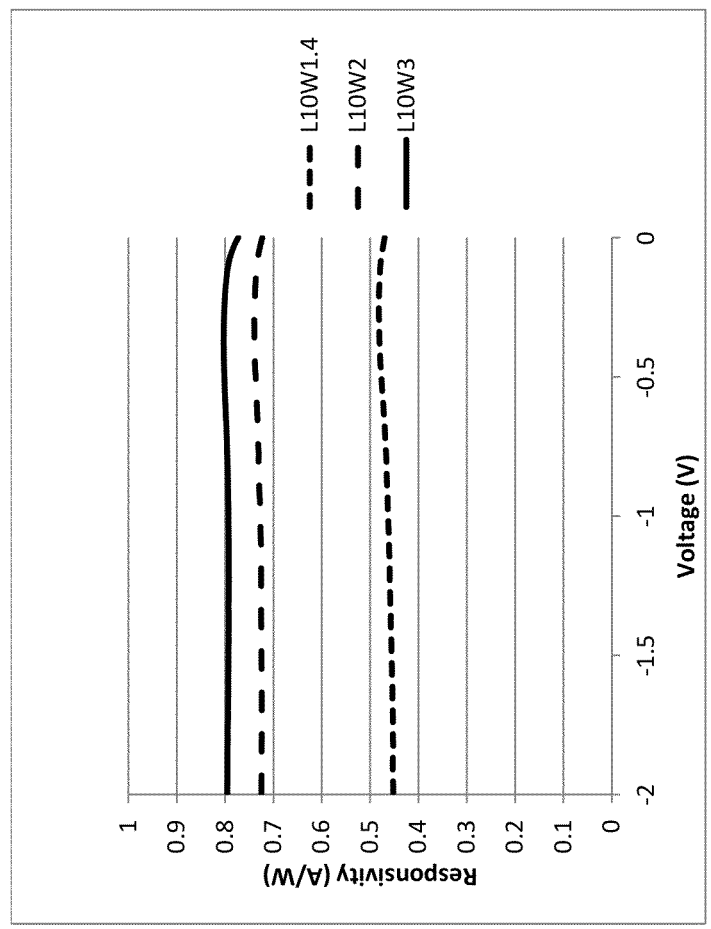
FIGS. 15-16 illustrate experimental results comparing a typical germanium waveguide-integrated photodetector with the disclosed germanium waveguide-integrated photodetector, in accordance with some embodiments.
Figure 16:
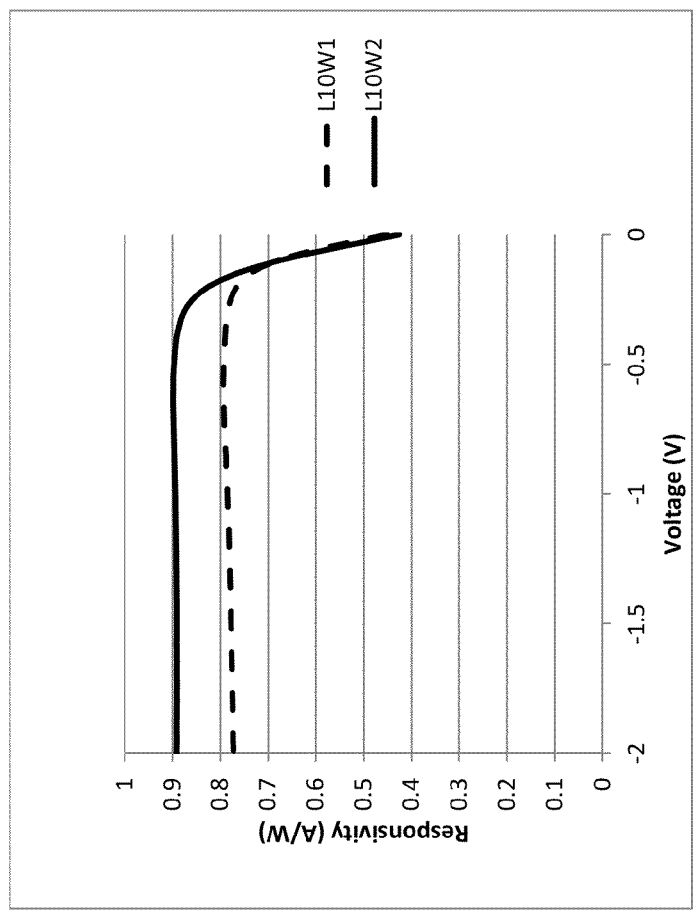

FIGS. 15-16 illustrate experimental results comparing a typical germanium waveguide-integrated photodetector (FIG. 15) with the disclosed germanium waveguide-integrated photodetector (FIG. 16), in accordance with some embodiments. The experimental results are for a wavelength of 1.5 micrometer. The final thickness of the germanium layer was about 200 nm. Results are shown for devices with 10 micrometer length (L10) and for different widths (W=1.4 micron, 2 micron, 3 micron and 1 micron, 2 micron respectively).

From the experimental results, it can be concluded that, for the same device size, a clearly better responsivity is obtained for the disclosed inverted rib structure than for the typical germanium photodetector. It can also be concluded that the responsivity is much less influenced by device width in the case of an inverted rib structure, as compared to the typical germanium photodetector.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to include any specific characteristics of the features or aspects of the invention with which that terminology is associated.

What is claimed is:

1. A method comprising:
   providing a planarized silicon-based photonics substrate comprising a silicon waveguide structure;
   depositing a dielectric layer over the planarized silicon-based photonics substrate;
   selectively etching the dielectric layer, thereby exposing at least a portion of the silicon waveguide structure;
   selectively etching the exposed portion of the silicon waveguide structure to form a step-like template;
   using the silicon waveguide structure as a seed layer to selectively grow in the step-like template a germanium layer that extends above the dielectric layer; and
   planarizing the germanium layer to form a planarized germanium layer, wherein the planarized germanium layer does not extend above the dielectric layer and, as a result of the step-like template, has an inverted rib shape, wherein the inverted rib shape comprises a lower portion and an upper portion that is wider than the lower portion, wherein the lower portion comprises an optically-active region, and wherein the upper portion comprises laterally-overhanging portions that extend laterally above and beyond either side of the optically active region lower portion.

2. The method of claim 1, wherein the dielectric layer comprises an oxide layer.

3. The method of claim 2, wherein the oxide layer comprises a $SiO_2$ layer.

4. The method of claim 1, further comprising, before planarizing the germanium layer, annealing the germanium layer.

5. The method of claim 1, wherein the planarized germanium layer has a thickness between about 100 nm and about 500 nm.

6. The method of claim 1, wherein planarizing the germanium layer comprises using a chemical mechanical polish to planarize the germanium layer.

7. The method of claim 1, further comprising:

forming a germanium photodetector structure comprising the planarized germanium layer.

8. The method of claim 1, wherein the optically-active region has a thickness between about 250 nm and about 300 nm.

9. The method of claim 1, further comprising providing metal contacts in electrical contact with the laterally-overhanging portions, wherein the metal contacts and the optically-active region are separated by a lateral distance of at least 50 nm.

10. A method comprising:

providing a planarized silicon-based photonics substrate comprising a first silicon waveguide structure and a second silicon waveguide structure;

depositing a dielectric layer over the planarized silicon-based photonics substrate;

selectively etching the dielectric layer, thereby exposing at least a portion of the first silicon waveguide structure;

selectively etching the exposed portion of the first silicon waveguide structure to form a template;

using the first silicon waveguide structure as a seed layer to selectively grow in the template a germanium layer that extends above the dielectric layer;

planarizing the germanium layer to form a planarized germanium layer, wherein the planarized germanium layer does not extend above the dielectric layer;

forming a germanium photodetector structure comprising the first planarized germanium layer;

bonding a III-V layer to the dielectric layer at a distance of less than about 100 nm from the second silicon waveguide structure; and integrating a hybrid laser structure with the planarized silicon-based photonics substrate, wherein the hybrid laser structure comprises the III-V layer.

11. The method of claim 10, wherein as a result of the first template, the first planarized germanium layer has an inverted rib shape.

12. The method of claim 10, further comprising, in a single processing step, forming contacts to the first silicon waveguide structure, the second silicon waveguide structure, the germanium photodetector structure, and the hybrid laser structure.

13. The method of claim 1, wherein a bottom surface of each of the laterally-overhanging portions is in contact with the dielectric layer.

* * * * *